United States Patent [19]

Aita et al.

[11] Patent Number: 5,122,751

[45] Date of Patent: Jun. 16, 1992

[54] DEVICE FOR DETECTING RESIDUAL CAPACITY OF A BATTERY BOTH IN LOAD AND NO LOAD CONDITIONS

[75] Inventors: Takayuki Aita; Kazuo Honda; Akira Sanpei; Hiroshi Ogata, all of Fukushima, Japan

[73] Assignee: Sony Corporation, Tokyo, Japan

[21] Appl. No.: 641,305

[22] Filed: Jan. 15, 1991

[30] Foreign Application Priority Data

Jan. 16, 1990 [JP] Japan ..................... 2-6836

[51] Int. Cl.⁵ ........................... G01N 27/416
[52] U.S. Cl. ................... 324/429; 324/433; 324/426
[58] Field of Search ........... 324/426, 429, 433, 434, 324/435; 340/636, 661

[56] References Cited

U.S. PATENT DOCUMENTS

| | | | |
|---|---|---|---|
| 4,020,414 | 4/1977 | Paredes | 324/433 |
| 4,316,185 | 2/1982 | Watrous et al. | 324/433 X |
| 4,521,735 | 6/1985 | Kageyama et al. | 324/433 |

Primary Examiner—Jack B. Harvey
Attorney, Agent, or Firm—Hill, Van Santen, Steadman & Simpson

[57] ABSTRACT

A device for detecting and displaying residual capacity of a battery comprises a comparator comparing detection voltages set to predetermined values and open circuit voltage. The device further contains circuitry to compensate the difference of the open circuit voltage and the closed circuit voltage of the battery. Thus the device can detect the residual capacity of the battery under conditions both with and without the external load.

7 Claims, 7 Drawing Sheets

DEVICE FOR DETECTING RESIDUAL CAPACITY OF A BATTERY BOTH IN LOAD AND NO LOAD CONDITIONS

BACKGROUND OF THE INVENTION

The present invention relates to a device for detecting the residual capacity of a battery, especially, a lithium secondary battery.

With the recent development of small size and portable equipment, secondary batteries such as nickel-cadmium batteries have come to be used for power supplies for radio-cassette recorders and portable VTRs. As long as an A.C. power source is used, there is no fear of exhaustion of the power supply, but when a battery is used as the power source, the capacity of the battery is limited and, hence, depending on the apparatus used, it becomes very important to know how long the apparatus can further be used. In such case, if there is provided a device to display the residual or used capacity of the battery, it becomes easy to presume how long the residual operating time. This would offer much convenience to the user.

However, the discharge curve of a nickel-cadmium cell today is flat as shown in FIG. 7 by curve I and, hence, it is very difficult to detect its residual capacity. Since the discharge curve of a lead cell is also relatively flat as shown by curve II in FIG. 7, detection of the residual capacity is also difficult, though it is not so difficult as with the nickel-cadmium cell.

In contrast, in the case of a lithium secondary cell, its discharge curve is sloped as shown by curve III in FIG. 7 and, hence, it becomes possible to detect the residual capacity of the cell from the discharge curve. Conventionally, checking of the consumed state of a lithium secondary battery has been performed, as is also described in Japanese Laid-Open Patent Publication No. Hei 1-100465 and No. Hei 1-100479, with the actual load connected thereto when performed in the loaded state, and with a dummy resistor corresponding to the actual load connected when performed in the unloaded state. Then, in the case of a lithium secondary battery with a video camera connected thereto as the actual load, the load is of the order of several watts and, hence, in the measurement under a no load condition, a corresponding dummy resistor of several watts becomes necessary. Besides, since the discharge curve of the lithium secondary battery is such that the discharge voltage greatly varies with the discharge load, accurate detection of the residual capacity becomes difficult. This is because, for example, when a lithium battery is used as the power source of an 8 mm video camera, the load greatly changes according to how its zoom mechanism is operated or stopped, and the display of the residual capacity is affected by the change.

Further, a large load connected to the battery as the dummy resistor for checking the residual capacity of the battery consumes power wastefully. This cannot be reasonable and even leads to such great disadvantages that heat is produced and the device becomes bulky.

SUMMARY OF THE INVENTION

The present invention has been made in view of the foregoing various problems. Accordingly, a primary object of the present invention is to provide a device for detecting the residual capacity of a battery, making use of the possibility of measurement of the residual capacity of a lithium secondary battery from its open-circuit voltage, by measuring either the open-circuit voltage or the closed-circuit voltage without connecting a dummy resistor to the battery.

An additional object of the present invention is to provided a battery residual capacity detection device capable of accurately detecting the residual capacity of the battery in either the loaded or unloaded states. The battery residual capacity dectection device according to the present invention includes a battery having a discharge characteristic such that the open-circuit voltage thereof becomes lower as the discharge becomes deeper. A plurality of comparators are provided for comparing the open-circuit voltage of the battery with a plurality of detection voltages set to predetermined voltage values. Display members are driven by outputs of the comparators to display the residual capacity in step-wise fashion.

Also according to the invention, a means is provided for compensating for the difference between the open-circuit voltage and the closed-circuit voltage in the loaded state and unloaded state. In one embodiment, a Schottky diode voltage drop provides the compensation. In another embodiment, a resistor connected to one of the comparators is provided with a shorting switch thereacross to provide the compensation.

DESCRIPTION OF THE PREFERRED EMBODIMENTS

Figure 1:
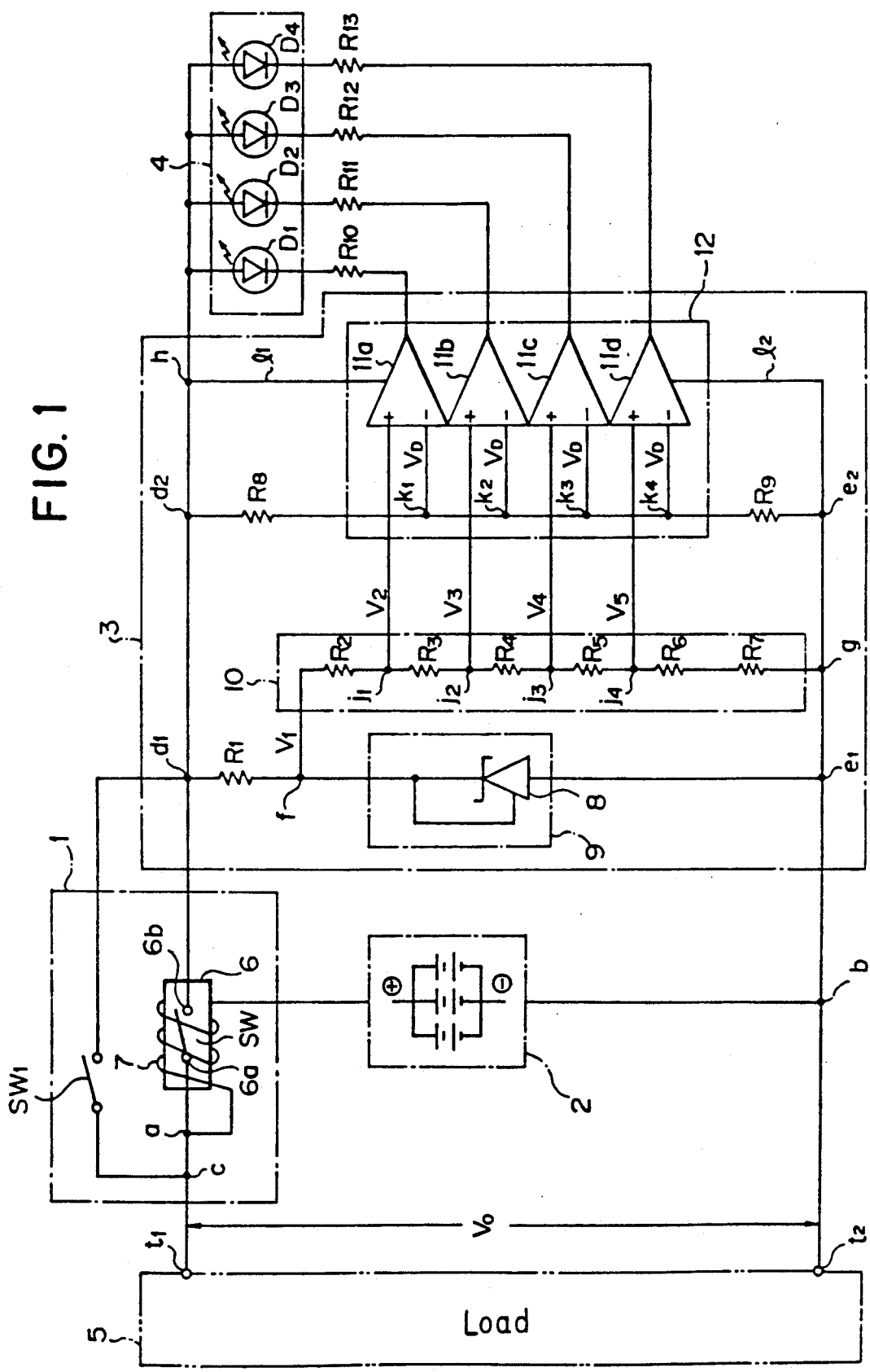
FIG. 1 is a circuit diagram showing an arrangement of a battery residual capacity detection device according to a first embodiment.

According to the arrangement of the first embodiment of the present invention as shown in FIG. 1, the open-circuit voltage of the battery 2 shown at the time the battery is separated from its discharge load is displayed through a plurality of comparators 11a to 11d on the display members $D_1$ to $D_4$ in stepwise fashion. Hence, the residual capacity of the battery 2 can be detected without connecting a dummy resistor thereto in the no load state. Therefore, in whatever apparatus the battery 2 may be used, its residual capacity can be detected and displayed, and essentially no loss is made in the capacity of the battery 2 and no heat is produced when the residual capacity is detected and displayed. Thus, a small size and lightweight device can be provided.

Figure 4:
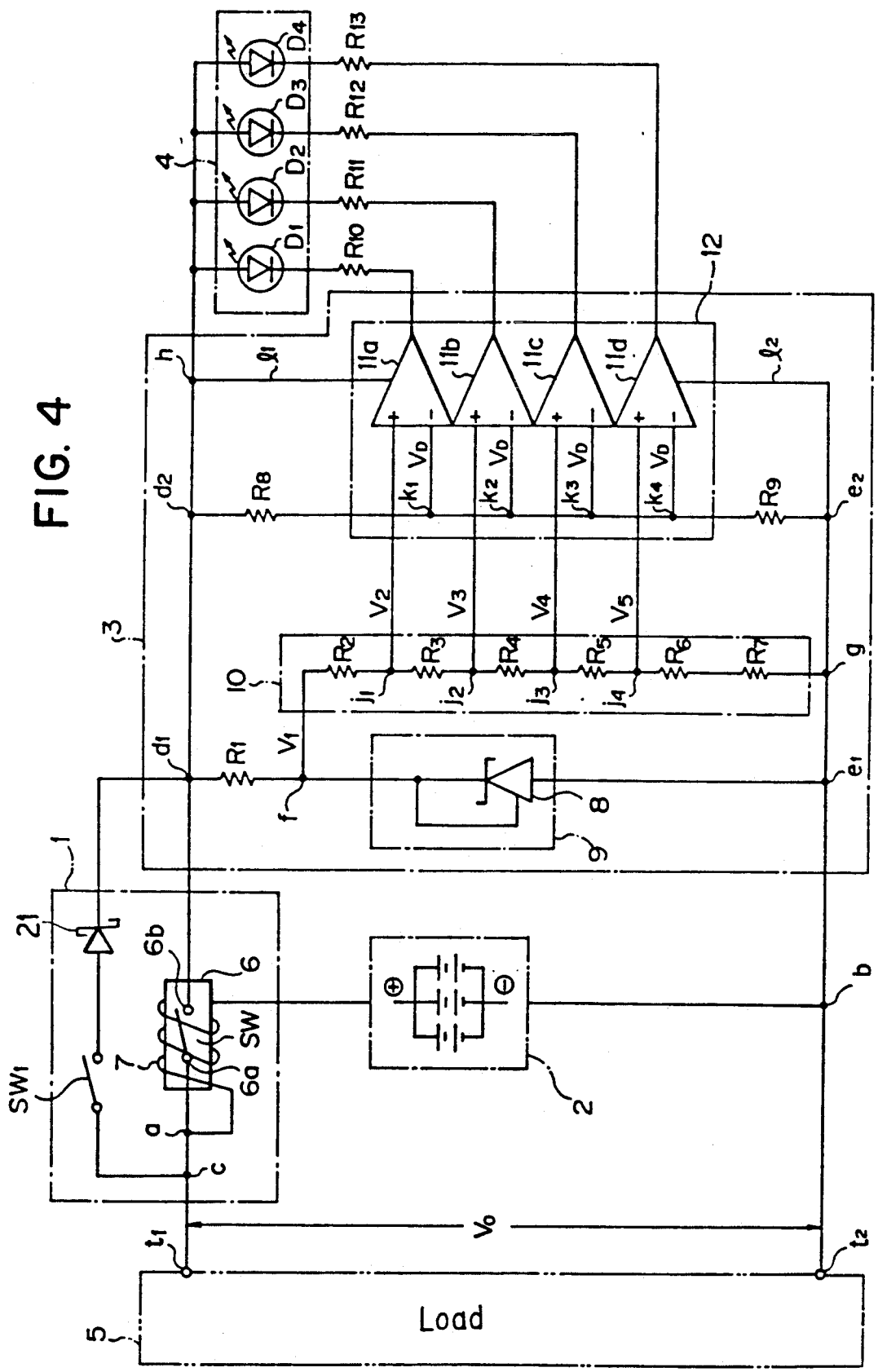
FIG. 4 is a circuit diagram showing an arrangement of a battery residual capacity detection device according to a second embodiment.

According to the arrangement of the second embodiment of the present invention shown in FIG. 4, it is adapted such that the difference between the closed circuit voltage with a discharge load connected and the open-circuit voltage shown at the time the battery is separated from its discharge load is compensated for by diode means 21. The compensated open-circuit voltage is displayed through a plurality of comparators 11a to 11d on the display members $D_1$ to $D_4$ in stepwise fashion. Hence, the residual capacity of the battery 2 can be detected without connecting a dummy resistor thereto in the no load state and, also, the residual capacity of the battery in either of the loaded or unloaded states can be accurately detected. Therefore, in whatever apparatus the battery 2 may be used, its residual capacity can be detected and displayed, and essentially no loss is made in the capacity of the battery 2 and no heat is produced when the residual capacity is detected and displayed. Thus a small size and lightweight device can be provided. In addition, the accuracy of the detection of the residual capacity can be enhanced.

Figure 5:
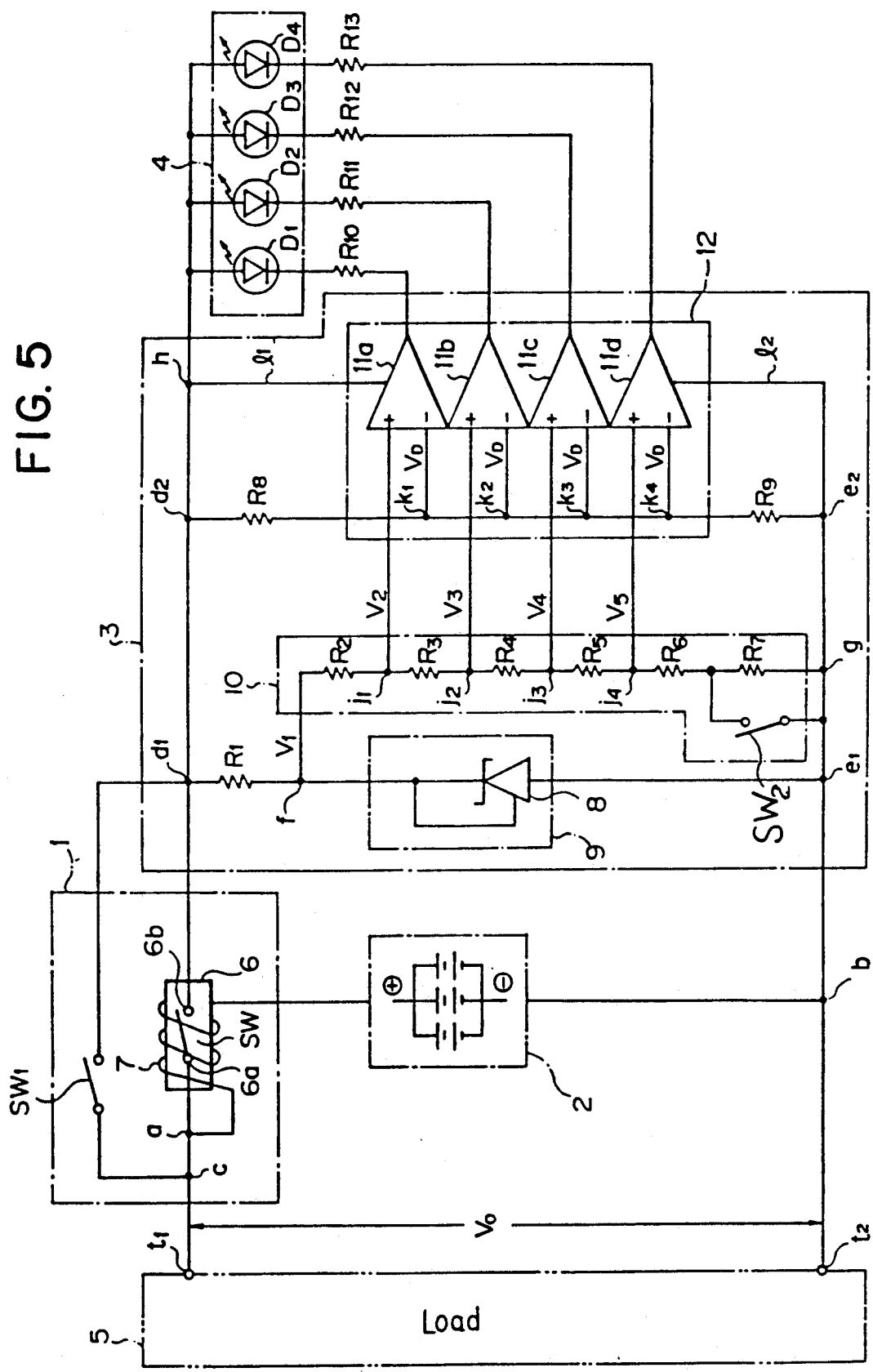
FIG. 5 is a circuit diagram showing an arrangement of a battery residual capacity detection device according to a third embodiment.

According to the arrangement of the third embodiment of the present invention shown in FIG. 5, that the open-circuit voltage shown at the time the load is separated from the battery is compared with the detection voltages $V_2$ to $V_5$ compensated for in selective ways by use of switch $Sw_2$ according to how the battery is loaded or unloaded by a plurality of comparators 11a to 11d. Outputs of these comparators 11a to 11d are displayed on the display members $D_1$ to $D_4$ in stepwise fashion. Hence, the residual capacity of the battery 2 can be detected without connecting a dummy resistor thereto in the no load state and, also, the residual capacity of the battery in either of the loaded or unloaded states can be accurately detected. Therefore, in whatever apparatus the battery 2 may be used, the residual capacity can be detected and displayed, and essentially no loss is made in the capacity of the battery 2 and no heat is produced when the residual capacity is detected and displayed. Thus a small size and lightweight device can be provided. In addition, the accuracy of the detection of the residual capacity can be further enhanced.

Referring to FIG. 1 to FIG. 6, embodiments of the present invention will be described below.

Figure 6:
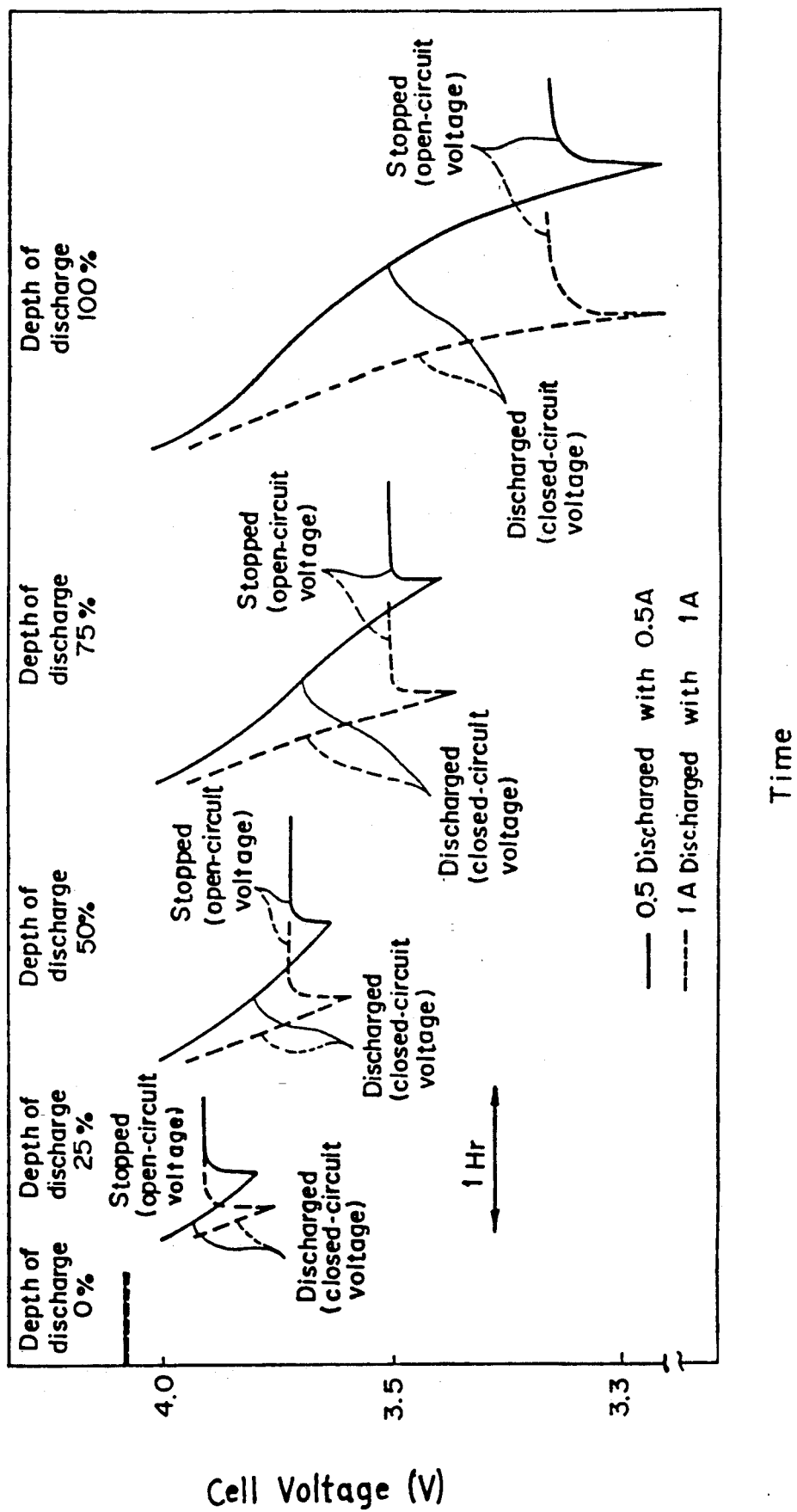
FIG. 6 shows characteristic curves showing dependency on the depths of discharge of open-circuit voltages.
Figure 7:
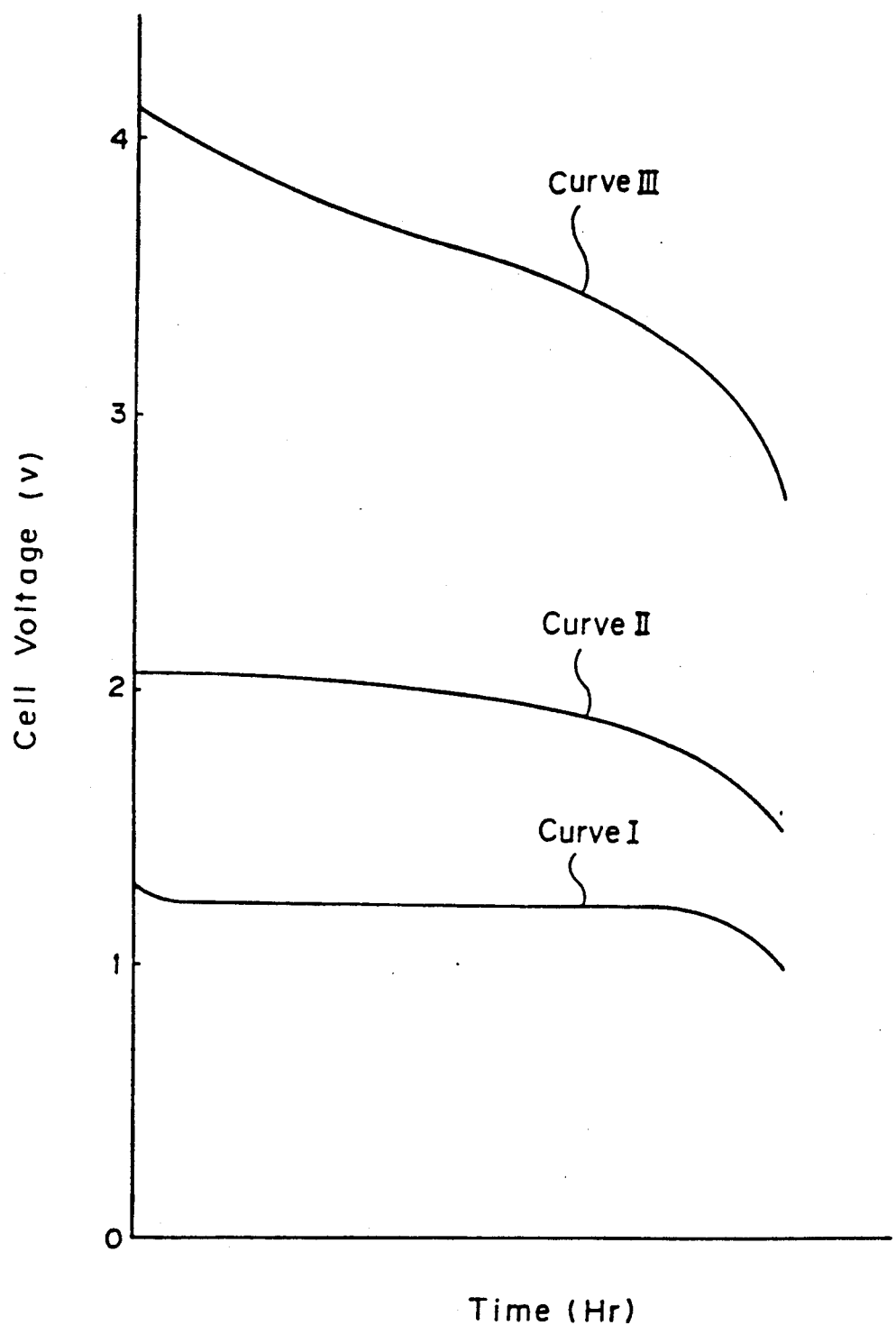
FIG. 7 shows discharge characteristics of various kinds of cells.

As the introduction to the description of the embodiment of the present invention, discharge characteristics with respect to open-circuit voltage of a lithium secondary cell will be described with reference to FIG. 6.

Through experiments conducted by us, we found that the lithium secondary cell, when separated from a discharge load, has a very high voltage recovery speed and the open-circuit voltage at that time largely depends on the depth of discharge. In FIG. 6 are shown voltage curves (in a continuous line) obtained when a non-aqueous electrolyte secondary cell, 20 mm in outer diameter and 42 mm high, with the positive electrode formed of double oxide of lithium and cobalt and the negative electrode formed of baked organic high polymer, was discharged to depths from 0%, through 25%, 50%, 75%, to 100% at a constant current of 0.5 A. Then the discharging was stopped. Voltage curves (in broken line) were also obtained when the same cell was discharged to depths from 0%, through 25%, 50%, 75%, to 100% at a constant current of 1 A. Then the discharging was stopped. As shown in these curves, each cell, when the discharging is stopped, reaches open-circuit voltages virtually at the same level in a short period of time. Besides, it can be said that the open-circuit voltages do not depend on the discharge load, but on the depth of discharge. The below described embodiment makes use of the above described characteristics of the lithium secondary cell, and it displays, stepwise, on its display device, with precision, the open-circuit voltage of the lithium secondary cell and the residual capacity of the cell presumed through a comparison between preset detection voltages and the open-circuit voltage.

Now, description of the embodiments of the present invention will be given below with reference to FIG. 1 to FIG. 5.

A device for indicating residual capacity of a lithium battery according to a first embodiment comprises, as shown in FIG. 1, a switch portion 1, a battery portion 2, a comparison portion 3, and a display portion 4. A load 5 of a video camera, for example, is connected to a terminal $t_1$ on the side of the positive electrode and a terminal $t_2$ on the side of the negative electrode.

The switch portion 1 is made up of a check switch $SW_1$ and a lead switch 6. The check switch $SW_1$ is turned ON in the event that the residual capacity of the battery portion 2 is checked when the load 5 has stopped its operation or the load 5 has been removed from both of the terminals $t_1$ and $t_2$, that is, when the battery is brought to an unloaded state. The lead switch 6 is made up of a switch SW, formed of a pair of spaced apart lead pieces 6a and 6b confronting each other, and which are made of ferromagnetic material and are adapted to be sucked in by an external magnetic field. A drive coil 7 is wound around the switch SW.

Figure 2:
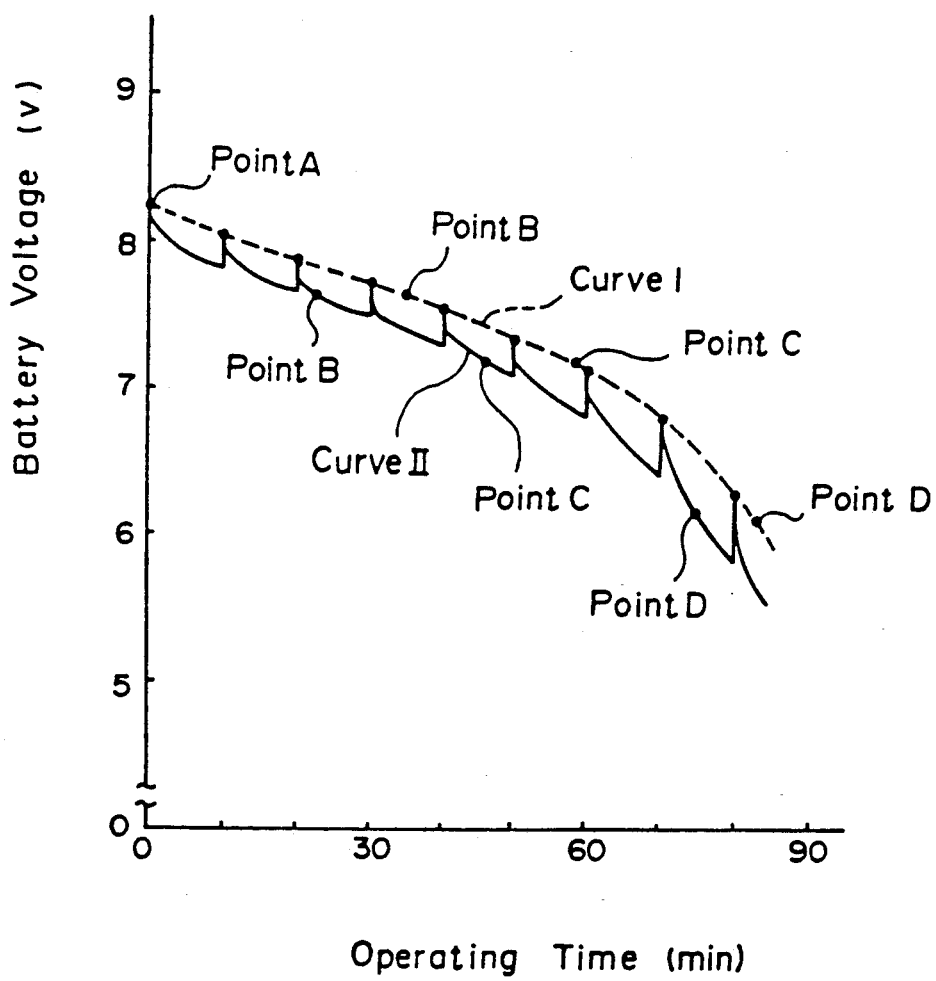
FIG. 2 shows characteristic curves showing discharge characteristics of an assembly of cells (battery portion) for the first embodiment.

The battery portion 2 is constituted formed of an assembly of cells, in which two cells are connected in series to form a set and three of such sets are connected in parallel, each cell being a lithium secondary cell, 14.0 mm in outer diameter and 50 mm high, with the positive electrode made of double oxide of lithium and cobalt and the negative electrode made of baked organic high polymer. The battery in the present embodiment has a discharge rate of 0.2 C at full charge with an upper voltage limit of 8.2 V, a cutoff voltage of 5.5 V, and a nominal electrical capacity of 1200 mAH. The above described battery was charged full at the upper limit voltage 8.2 V and then it was put into operation connected with a video camera, as a load 5, in its image recording state for 10 minutes, and then the battery was stopped for 20 minutes. Such operations were repeated and the voltage during the operation and during the stopping were recorded, whereby discharge characteristics as shown in FIG. 2 were obtained. In the characteristics, curve I shows the open-circuit voltage, that is, the recovered voltage during the period of stopping for 20 minutes (during the no-load period, i.e., when the load 5 was removed from both of the terminals $t_1$ and $t_2$), and curve II shows the closed-circuit voltage, that is, the voltage shown during the period of operation for 10 minutes (during the loaded period, i.e., the load 5 was connected to both of the terminals $t_1$ and $t_2$). From the characteristics, it is known that the open-circuit voltage of the lithium secondary cell is dependent on the depth of discharge while it supplies a load.

The comparison portion 3 is made up of a reference voltage generation portion 9 formed of a constant-voltage diode (zener diode) 8, a voltage network 10 formed of resistors $R_2$ to $R_7$ connected in parallel with the reference voltage generation portion 9, and a voltage comparison IC 12 formed, for example, of four operational amplifiers or comparators (hereinafter, simply called "comparators") 11a to 11d.

The display portion 4 is made up of a plurality of for example four light emitting diodes $D_1$ to $D_4$, in the present embodiment, corresponding to the comparators 11a to 11d.

The comparators 11a to 11d each include a drive transistor for driving each of the light emitting diodes $D_1$ to $D_4$. As the display members constituting the display portion 4, liquid crystal display devices (LCD) or others may be used instead of the above mentioned light emitting diodes $D_1$ to $D_4$, provided that these can be driven with small power.

The positive electrode (+) of the battery portion 2 is led out to the terminal $t_1$ on the positive side through the drive coil 7 of the lead switch 6 and a junction a, while the negative terminal (−) of the battery portion 2 is led out to the negative terminal $t_2$ through a junction b. One lead piece 6a of the lead switch 6 is connected with the electrode $t_1$ on the positive side, while the other lead piece 6b is connected with a first junction $d_1$ on the positive side of the comparison portion 3. The check switch $SW_1$ of the switch portion 1 is connected between the junction c, between the lead piece 6a and the terminal $t_1$ on the positive side, and the first junction $d_1$ on the positive side of the comparison portion 3. Between the first junction $d_1$ on the positive side of the comparison portion 3 and a first junction $e_1$ on the negative side, there is connected a resistor $R_1$ and the reference voltage generation portion 9. Between a junction f, between the resistor $R_1$ and the reference voltage generation portion 9, and a junction q on the negative side, there is connected a voltage network 10 formed of six resistors $R_2$ to $R_7$ connected in series. Between a second junction $d_2$ on the positive side of the comparison portion 3 and a second junction $e_2$ on the negative side, there is connected resisters $R_8$ and $R_9$ in series. A line $l_1$ extended from a junction h on the positive side to the side of the voltage comparison IC and a line $l_2$ extended from the voltage comparison IC to the junction $e_2$ on the negative side are power supply lines for the voltage comparison IC 12. Four junctions $J_1$ to $j_4$ located between the resistors $R_2$ and $R_6$ are respectively connected to positive terminals (+) of the comparators 11a to 11d, whereby junction voltages (i.e., reference detection voltages) $V_2$ to $V_5$ are each adapted to be supplied to the positive terminal (+) of each of the comparators 11a to 11d. Four junctions $k_1$ to $k_4$ located between the resistors $R_8$ and $R_9$ are respectively connected to the negative terminals (−) of the comparators 11a to 11d, whereby a divided voltage $V_D$ (by the resistors $R_8$ and $R_9$) of the battery voltage $V_0$ from the battery portion 2 is adapted to be supplied to the negative terminal (−) of each of the comparators 11a to 11d. In the comparators 11a to 11d, the respective four detection voltages $V_2$ to $V_5$ provided by the resistors $R_2$ to $R_7$ are compared with the analog signal level (i.e., the divided voltage of the battery voltage) and in the event that the analog signal level $V_D$ is of the detection voltages $V_2$ to $V_5$, the corresponding comparator 11a to 11d is driven so that the drive transistor incorporated in the comparator 11a to 11d is turned ON. The light emitting diodes $D_1$ to $D_4$ of the display portion 4 are connected with the open collector terminals of the drive transistors within their corresponding comparators 11a to 11d, and the light emitting diodes $D_1$ to $D_4$ corresponding to the drive transistors turned ON are adapted to emit light. Resistors $R_{10}$ to $R_{13}$ connected between the light emitting diodes $D_1$ to $D_4$ and the comparators 11a to 11d are ones for allowing constant currents to be supplied to the light emitting diodes $D_1$ to $D_4$.

The operation of the first embodiment will be described below. In the present case, the resistors $R_1$ to $R_9$ are set, for example, to the values as shown in the following table. The output voltage $V_1$ of the reference voltage generation portion 9 is set to 2.5 V. Then, the detection voltages $V_2$ to $V_5$ at the junctions $j_1$ to $j_4$ become 2.0 V, 1.875 V, 1.75 V, and 1.5 V.

TABLE 1

| Resistor | Resistance |
|---|---|
| $R_1$ | 1.0 KΩ |
| $R_2$ | 10.0 KΩ |
| $R_3$ | 2.5 KΩ |
| $R_4$ | 2.5 KΩ |
| $R_5$ | 5.0 KΩ |
| $R_6$ | 25.45 KΩ |
| $R_7$ | 4.55 KΩ |
| $R_8$ | 77.5 KΩ |
| $R_9$ | 25.0 KΩ |

If a video camera 5 as the load is connected between both of the terminals $t_1$ and $t_2$ and the video camera 5 is put into operation, i.e., the device is brought into a loaded state, an operating current from the battery portion 2 is allowed to flow through the drive coil 7 of the lead switch 6 and, hence, the switch SW of the lead switch 6 is energized and turned ON. By the turning ON of the switch SW of the lead switch 6, the battery portion 2 and the comparison portion 3 are connected. At this time, the voltage $V_D$ at junctions $k_1$ to $k_4$ Of the voltage comparison IC 12 becomes $R_9/(R_8+R_9)$ of the battery voltage $V_0$ from the battery portion 2 (this voltage corresponds to the closed-circuit voltage as shown by curve II in FIG. 2). Accordingly, if the battery voltage $V_0$ is 8.2 V (that is, the voltage shown at the point A of the closed-circuit voltage (curve II) in FIG. 2), for example the voltage $V_D$ at the junctions $k_1$ to $k_4$ becomes 2.0 V. In this case, since that voltage is higher than all of the detection voltages $V_2$ to $V_5$ of the voltage network 10, all the comparators 11a to 11d are activated and all the drive transistors within the comparators 11a to 11d are turned ON, whereby all the light emitting diodes $D_1$ to to $D_4$ are lighted. Then, if the battery voltage $V_0$ is 7.69 V (that is, the voltage shown at the point B of the curve II in FIG. 2), for example, the voltage $V_D$ at the junctions $k_1$ to $k_4$ becomes 1.875 V, and, hence, three comparators 11b to 11d are activated and the corresponding three light emitting diodes $D_2$ to $D_4$ are lighted. Then, if the battery voltage $V_0$ is 7.175 V (that is, the voltage shown at the point C of the curve II in FIG. 2), for example the voltage $V_D$ at the junctions $k_1$ to $k_4$ becomes 1.75 V. Hence, two comparators 11c and 11d are activated and the corresponding two light emitting diodes $D_3$ and $D_4$ are lighted. Then, if the battery voltage $V_0$ is 6.15 V (that is, the voltage shown at the point D of the curve II in FIG. 2), for example the voltage $V_D$ at the junctions $k_1$ to $k_4$ becomes 1.5 V. Hence, only one comparator 11d is activated and only the corresponding light emitting diode $D_4$ is lighted. If the battery voltage $V_0$ is lower than 6.15 V, all the light emitting diodes $D_1$ to $D_4$ are turned off. In this way, the battery voltage $V_0$ of the battery portion 2 can be recognized to a considerable degree. Also, the residual capacity or residual operating time of the battery portion 2 can be presumed.

On the other hand, when the video camera 5 as the load, but not in operation, is connected with both of the terminals $t_1$ and $t_2$, Or when the video camera 5 is not connected with both of the terminals $t_1$ and $t_2$, that is, under a no-load condition, the battery voltage $V_0$ of the battery portion 2 (this voltage becomes the open-circuit voltage as shown by curve I in FIG. 2) is supplied, by turning ON the check switch $SW_1$ of the switch portion 1, to the comparison portion 3 through the drive coil 7 of the lead switch 6 and the check switch $SW_1$. Accordingly, in the same way as described above, the residual capacity of the battery portion 2 can be recognized and the residual operating time of the same can be presumed according to the state of the emitted light by the light emitting diodes $D_1$ to $D_4$. More Specifically, if the battery voltage $V_0$ is 8.2 V (that is, the voltage shown at the point A of the open-circuit voltage (curve I) in FIG. 2), for example the voltage $V_D$ at the junctions $k_1$ to $k_4$ becomes 2.0 V. Hence, all the light emitting diodes $D_1$ to $D_4$ are lighted. If the battery voltage $V_0$ is 7.69 V (that is, the voltage shown at the point B of the curve I in FIG. 2), for example, the voltage $V_D$ at the junctions $k_1$ to $k_4$ becomes 1.875 V. Hence, the three light emitting diodes $D_2$ to $D_4$ are lighted. If the battery voltage $V_0$ is 7.175 V (that is, the voltage shown at the point C of the curve I in FIG. 2), for example, the voltage $V_D$ at the junctions $k_1$ to $k_4$ becomes 1.75 V. Hence, the two light emitting diodes $D_3$ and $D_4$ are lighted. If the battery voltage $V_0$ is 6.15 V (that is, the voltage shown at the point D of the curve I in FIG. 2), for example the voltage $V_D$ at the junctions $k_1$ to $k_4$ becomes 1.5 V. Hence, only one light emitting diode $D_4$ is lighted. In this way, the residual capacity of the battery portion 2 can be presumed according to the lighting state of the light emitting diodes $D_1$ to $D_4$. The detection voltages $V_2$ to $V_5$ as the reference voltages for the operations of the comparators $11a$ to $11d$ can be suitably adjusted by changing the resistance values of the resistors $R_2$ to $R_7$ constituting the voltage network 10.

According to the first embodiment, as described above, the open-circuit voltage shown by the battery portion when it is separated from a discharge load is allowed, through the check switch $SW_1$ and the plurality of comparators $11a$ to $11d$, to be displayed stepwise by a plurality of light emitting diodes $D_1$ to $D_4$. Hence, in detecting the residual capacity in a no load state, the residual capacity of the battery portion 2 can be detected without connecting thereto a dummy resistor corresponding to the load 5. Therefore, in whatever apparatus the battery portion 2 may be used, the residual capacity can be detected and displayed, and essentially no loss is made in the capacity of the battery portion 2 and no heat is produced when the residual capacity is detected and displayed. Thus, a small size and lightweight device can be provided.

Figure 3:
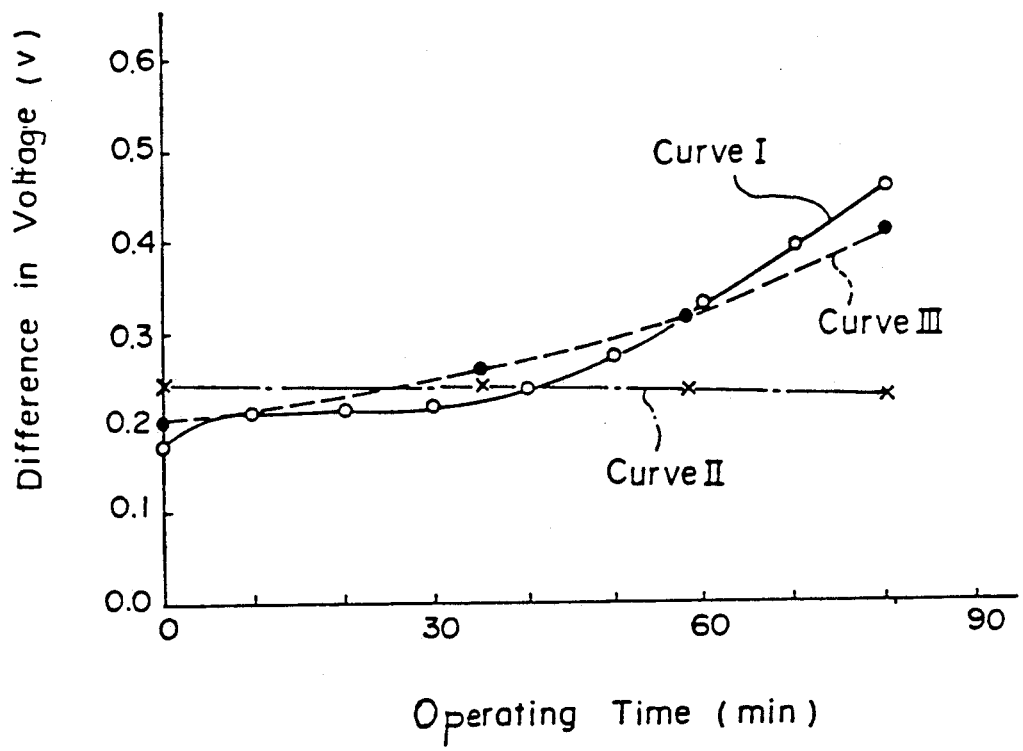
FIG. 3 shows characteristic curves showing differences between open-circuit voltages and closed-circuit voltages.

In the above described first embodiment, the reference points for checking the residual capacity of the battery portion 2 are different as the battery is loaded or unloaded. More specifically, the residual operating times is presumed in the loaded condition due to the fact that the points A to D on the curve I (open-circuit voltage) in FIG. 2 and the points A to D on the curve II (closed-circuit voltage) are not respectively aligned in the vertical direction. This is because there exists some difference between the open-circuit voltage and the closed-circuit voltage. The differences between the open-circuit voltage and the closed-circuit voltage with respect to the axis of time obtained on the basis of FIG. 2 are shown in the graph of FIG. 3. Referring to the figure, the curve I shows the actual difference between the open-circuit voltage and the closed-circuit voltage, while curves II and III show differences between the open-circuit voltage and the closed-circuit voltage in the later described second and third embodiments which are provided with compensation means, respectively. It is known that measurements in the first embodiment are directly effected by the differences (curve I).

A battery residual capacity display device according to the second embodiment shown in FIG. 4 is provided with a means for compensating for the difference between the open-circuit voltage and the closed-circuit voltage, such as a Schottky barrier diode 21, connected at the rear of the check switch $SW_1$ in the switch portion 1. Parts in FIG. 4 corresponding to those in FIG. 1 are denoted by like reference numerals.

According to the present battery residual capacity display device, when the check switch $SW_1$ is turned ON in detecting the residual amount in a no load state, the battery voltage (open-circuit voltage, in this case) $V_0$ of the battery portion 2 undergoes a voltage drop by means of the diode 21, whereby the open-circuit voltage between the junctions $d_2$ and $e_2$ is allowed to virtually make a parallel displacement toward the closed-circuit voltage approximately by 0.24 to 0.23 V. More specifically, as shown by curve II in FIG. 3, the actual difference 0.22 V between the open-circuit voltage and the closed-circuit voltage shown by the curve I at the point of 35 minutes is approximated to 0.24 V.

Thus, in the detection of the residual capacity in a no load state according to the second embodiment, the residual capacity of the battery portion 2 can be detected without connecting thereto a dummy resistor corresponding to the load 5, the same as in the first embodiment, and essentially no loss is made in the capacity of the battery portion 2 and no heat is produced when the residual capacity is detected and displayed. Thus, a small size and lightweight device can be provided. In addition, since the difference between the open-circuit voltage and the closed-circuit voltage can be compensated for, the remaining charge amounts in the loaded and unloaded states can be detected with precision.

A battery residual capacity display device according to a third embodiment will be described below. In the above second embodiment, the difference toward the end of the discharge, for example, at 80 minutes, is 0.23 V as shown in FIG. 3. This value is not approximate 0.46 V, the actual difference. In other words, satisfactory compensation is not made toward the end of the discharge by the second embodiment. The present third embodiment is therefore designed to be capable of compensating for the difference between the open-circuit voltage and the closed-circuit voltage from the beginning of the discharge toward the end of the discharge. For this purpose, as described hereafter a check switch $SW_2$ is provided. Parts corresponding to those in FIG. 1 are denoted by like reference numerals.

The present residual capacity display device is arranged such that the resistor $R_7$ of the voltage network 10 formed of the resistors $R_2$ to $R_7$ is provided with a check switch $SW_2$ connected in parallel thereto. The check switch $SW_2$ operates in interlocked fashion with the check switch $SW_1$ in the switch portion 1, that is the same is turned OFF in an unloaded state, i.e. when the check switch $SW_1$ is turned ON, and it is turned ON in a loaded state, i.e. when the check switch $SW_1$ is turned OFF.

Accordingly, in the loaded state, the resistor $R_7$ is shorted by the check switch $SW_2$ and hence the detection voltages $V_2$ to $V_5$ are determined by the resistors $R_2$ to $R_6$ with respect to the reference voltage $V_1$. On the other hand, in the unloaded state, since the check switch $SW_2$ is turned OFF, the resistor $R_7$ contributes to the determination of the detection voltages $V_2$ to $V_5$. In the third embodiment, by thus selectively adding and not adding the resistor $R_7$ to the resistors $R_2$ to $R_6$, the detection voltages $V_2$ to $V_5$ are compensated for and the compensation for the difference between the open-circuit voltage and the closed-circuit voltage is achieved.

More specifically, in the unloaded state, the check switch $SW_1$ is turned ON and the check switch $SW_2$ is turned OFF and, hence, the detection voltages $V_2$ to $V_5$ are set to 2.0 V, 1.875 V, 1.75 V, and 1.5 V, respectively. Therefore, the same as in the case of the above described first embodiment, if the battery voltage of the battery portion 2 (an open-circuit voltage, in this case) $V_0$ is 8.2 V, for example all the light emitting diodes $D_1$ to $D_4$ are lighted. If the battery voltage $V_0$ is 7.69 V, for example, three light emitting diodes $D_2$ to $D_4$ are lighted. If the battery voltage $V_0$ is 7.175 V, for example, two light emitting diodes $D_3$ to $D_4$ are lighted. If the battery voltage $V_0$ is 6.15 V, for example, one light emitting diode $D_4$ only is lighted. On the other hand, in the loaded state, the check switch $SW_1$ is turned OFF and the check switch $SW_2$ is turned ON and, hence, the detection voltages $V_2$ to $V_5$ are set to 1.95 V, 1.8125 V, 1.675 V, and 1.4 V, respectively. Therefore, if the battery voltage of the battery portion 2 (an closed-circuit voltage, in this case) $V_0$ is 7.995 V, for example, all the light emitting diodes $D_1$ to $D_4$ are lighted. If the battery voltage $V_0$ is 7.43 V, for example, three light emitting diodes $D_2$ to $D_4$ are lighted. If the battery voltage $V_0$ is 6.87 V, for example two light emitting diodes $D_3$ to $D_4$ are lighted. If the battery voltage $V_0$ is 5.74 V, for example one light emitting diode $D_4$ only is lighted. When the differences between the open-circuit voltage and the closed-circuit voltage from the battery portion 2 are obtained, they become 0.205 V, 0.26 V, 0.305 V, and 0.41 V. Thus, as shown by the curve III in FIG. 3, the differences can be approximated to the actual differences between the open-circuit voltage and the closed-circuit voltage that are shown by the curve I over the period from the beginning of the discharge toward the end of the discharge.

In the detection of the residual capacity in a no load state according to the third embodiment, the residual capacity of the battery portion 2 can be detected without connecting a dummy resistor corresponding to the load 5 thereto, the same as in the first and second embodiments, and essentially no loss is made in the capacity of the battery portion 2 and no heat is produced when the residual capacity is detected and displayed. Thus, a small size and lightweight device can be provided. In addition, since the difference between the open-circuit voltage and the closed-circuit voltage can be better compensated for, the remaining charge amounts in loaded and unloaded states can be detected with higher precision.

According to the first to third embodiments as described above, the residual capacity of the battery portion 2 can be confirmed at any time and the residual operating time can be presumed from the lighting state of the light emitting diodes $D_1$ to $D_4$. The need for a separate tester or battery checker can be eliminated. However, in case residual capacity of the battery is measured by a separate battery checker, the battery checker operates as the first to third embodiments by simply removing the switch portion 1, and contacting the battery terminal to a pair of terminals connected to b and d, respectively. Further, such problems hitherto encountered can be solved if it is feared that a battery might run down any moment. Besides, the display of the residual capacity by the residual amount display device is automatically operated while an apparatus (a video camera 5 in the above described example) is in operation, and this offers convenience to the user. Especially in the automatic operation, since a lead switch 6 utilizing electromagnetic force is used, it can be operated with sufficiently smaller energy than the power required for operating the apparatus.

Although a lithium secondary battery was used as the battery portion 2 in the above described examples, the battery is not limited to that, but the present invention is applicable to any battery provided such that the residual capacity thereof can be detected from its open-circuit voltage. The invention is applicable to both a primary battery and a secondary battery. Furthermore, it is not only applicable to the video camera but also is applicable to small size and portable equipment such as a radio and a radio-cassette recorder and other equipment, as a battery residual capacity display device.

Although the above embodiments were described as to examples thereof applied to the residual charge display devices of lithium secondary batteries, the same can be applied to a battery provided with a function to display its residual capacity or a charger provided with a function to display the residual capacity.

The battery residual capacity display device according to the present invention includes a battery having a discharge characteristic such that the open-circuit voltage thereof becomes lower as its discharge becomes deeper. Comparators compare the open-circuit voltage of the battery with a plurality of detection voltages set to predetermined voltage values. Display members are driven by outputs of the comparators to display the residual capacity stepwise. Therefore, the open-circuit voltage and closed-circuit voltage of the battery can be measured without connecting a dummy resistor thereto. No loss is made in the capacity of the battery and no heat is produced when the residual capacity is detected and displayed. Thus, a small size and lightweight device can be provided.

The battery residual capacity display device according to the present invention includes a battery having a discharge characteristic such that the open-circuit voltage thereof becomes lower as its discharge becomes deeper. A means is provided for compensating for the difference between the open-circuit voltage and the closed-circuit voltage in the loaded state and unloaded state. Comparators compare the compensated open-circuit voltage with a plurality of detection voltages set to predetermined voltage values. Display members are driven by outputs of the comparators to display the residual capacity stepwise. Therefore, the open-circuit voltage and closed-circuit voltage of the battery can be measured without connecting a dummy resistor thereto. Essentially no loss is made in the capacity of the battery and no heat is produced when the residual capacity is detected and displayed. Thus, a small size and lightweight device can be provided. In addition, the residual capacity of the battery in the loaded state and unloaded state can be detected with precision.

The battery residual capacity display device according to the present invention includes a battery having a discharge characteristic such that the open-circuit voltage thereof becomes lower as its discharge becomes deeper. A means is provided for compensating for a plurality of detection voltages in selective ways according how the battery is loaded or unloaded. Comparators compare the open-circuit voltage of the battery with the compensated plurality of detection voltages. Display members are driven by outputs of the comparators to display the residual capacity stepwise. Therefore, the open-circuit voltage and closed-circuit voltage of the battery can be measured without connecting a dummy resistor thereto. Essentially no loss is made in the capacity of the battery and no heat is produced when the residual capacity is detected and displayed. Thus, a small size and lightweight device can be provided. In addition, the residual capacity of the battery in the loaded state and unloaded state can be detected with higher precision.

Although various minor changes and modifications might be proposed by those skilled in the art, it will be understood that we wish to include within the claims of the patent warranted hereon all such changes and modifications as reasonably come within our contribution to the art.

What is claimed is:

1. A device for detecting residual capacity of a battery, comprising:
   a pair of battery connection terminals connected to a battery which has a discharge characteristic such that an open-circuit voltage thereof without an external load being connected or a closed circuit voltage with the external load connected becomes lower as its discharge becomes deeper;
   comparator means for comparing the open-circuit or closed-circuit voltage of said battery with a plurality of detection voltages set to predetermined voltage values nd for providing an indication of a charge state of said battery; and
   means for compensating for a difference between said open-circuit voltage and said closed-circuit voltage so that said comparator means can compare either the closed-circuit or open-circuit voltages with said plurality of detection voltages such that the indication of battery charge state is substantially unaffected by whether or not the load is connected to the battery.

2. A device according to claim 1 further comprising said comparator means being a plurality of comparators, and wherein respective display member means are driven by outputs of said comparators for displaying in step-wise fashion the residual capacity of said battery.

3. A device according to claim 1 wherein said means for compensating comprises a device means for causing a voltage drop in a voltage being fed to said comparator means.

4. A device according to claim 3 wherein said device means comprises a Schottky diode.

5. A device according to claim 4 wherein said device means for causing a voltage drop between the open circuit voltage and the closed circuit voltage drop between the open circuit voltage and the closed circuit voltage is connected to a switch means for detecting when load current is being drawn for the battery.

6. A device according to claim 1 wherein said plurality of detection voltages are derived by dividing a reference voltage by a series connected plurality of resistors.

7. A device according to claim 6 wherein said means for compensating comprises switch means for selectively shorting across one of said plurality of resistors when the battery is connected to an external load.

* * * * *